(12) United States Patent
Nemoto

(10) Patent No.: US 6,603,364 B2
(45) Date of Patent: Aug. 5, 2003

(54) TEMPERATURE-COMPENSATED CRYSTAL OSCILLATOR AND METHOD OF TEMPERATURE COMPENSATION

(75) Inventor: Kenji Nemoto, Sagamihara (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/979,056

(22) PCT Filed: Mar. 16, 2001

(86) PCT No.: PCT/JP01/02120

§ 371 (c)(1), (2), (4) Date: Nov. 16, 2001

(87) PCT Pub. No.: WO01/69775

PCT Pub. Date: Sep. 20, 2001

(65) Prior Publication Data

US 2002/0158700 A1 Oct. 31, 2002

(30) Foreign Application Priority Data

Mar. 17, 2000 (JP) .......................................... 2000-76114

(51) Int. Cl.⁷ .............................. H03B 5/04; H03B 5/32
(52) U.S. Cl. .......................................... 331/66; 331/158
(58) Field of Search .............................. 331/65, 66, 69, 331/70, 116 R, 116 FE, 158, 175, 176, 177 R, 179; 310/315

(56) References Cited

U.S. PATENT DOCUMENTS 5,986,515 A    11/1999  Sakurai 6,362,699 B1 * 3/2002 Fry .............................. 331/176

FOREIGN PATENT DOCUMENTS

| JP | 4-367102 | 12/1992 |
|---|---|---|
| JP | 8-237030 | 9/1996 |
| JP | 10-261919 | 9/1998 |
| JP | 2000-341040 | 12/2000 |
| WO | WO 98/27652 | 6/1998 |

* cited by examiner

*Primary Examiner*—David C. Mis
(74) *Attorney, Agent, or Firm*—Finnegan, Henderson, Farabow, Garrett & Dunner, L.L.P.

(57) ABSTRACT

This temperature-compensated crystal oscillator includes: a temperature sensor 11; an analog type temperature compensating section 12; a digital type temperature compensating section 13; an adder circuit 14; and a voltage controlled crystal oscillating circuit 3. The analog type temperature compensating section 12 and the digital type temperature compensating section 13 each generate temperature compensation voltages based on an input voltage corresponding to the temperature detected by the temperature sensor 11. Both of these temperature compensation voltages are added to each other by the adder circuit 14 and the resultant added voltage is applied to a voltage control terminal of the voltage-controlled crystal oscillating circuit 3. Thereby, an oscillation frequency of the voltage-controlled crystal oscillating circuit 3 is stabilized, resulting in realization of the temperature compensation of a crystal resonator 4.

7 Claims, 5 Drawing Sheets

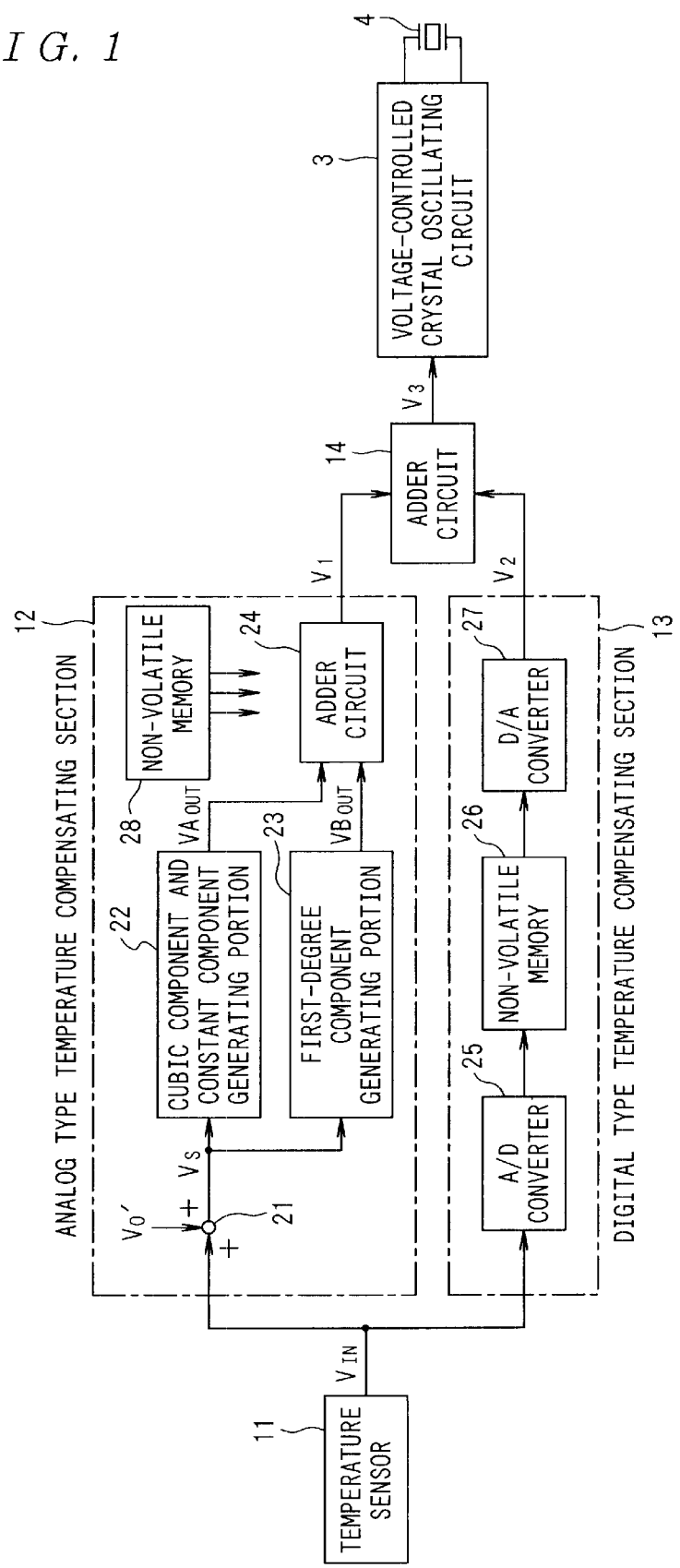
F I G. 1

FIG. 5

| TEMPERATURE (°C) | FREQUENCY DEVIATION (ppm) | |
|---|---|---|
| | BEFORE COMPENSATION | AFTER COMPENSATION |
| -30 | -7.17 | 0.5 |
| -25 | -4.11 | 0 |
| -20 | -1.75 | -0.18 |
| -15 | 0 | -0.16 |
| -10 | 1.18 | -0.18 |
| -5 | 1.87 | -0.26 |
| 0 | 2.13 | -0.25 |
| 5 | 2 | -0.16 |
| 10 | 1.59 | -0.04 |
| 15 | 0.94 | 0.03 |
| 20 | 0.11 | 0.07 |
| 25 | -0.81 | 0.04 |
| 30 | -1.78 | 0 |
| 35 | -2.68 | -0.04 |
| 40 | -3.49 | -0.04 |
| 45 | -4.11 | -0.01 |
| 50 | -4.5 | 0.06 |
| 55 | -4.57 | 0.17 |
| 60 | -4.25 | 0.27 |
| 65 | -3.45 | 0.33 |
| 70 | -2.06 | 0.43 |
| 75 | -0.03 | 0.55 |
| 80 | 2.72 | 0.69 |
| 85 | 6.29 | 1.06 |

TEMPERATURE-COMPENSATED CRYSTAL OSCILLATOR AND METHOD OF TEMPERATURE COMPENSATION

TECHNICAL FIELD

The present invention relates to a temperature-compensated crystal oscillator for which temperature compensation is possible and which brings a signal of a predetermined frequency into oscillation, and to a method of performing the temperature compensation of the crystal oscillator.

BACKGROUND ART

Conventionally, the following four methods have been known as the methods of temperature compensating crystal oscillators.
(1) Direct Compensation Type In this type, the oscillation loop of a crystal oscillator has a temperature compensating circuit comprising a capacitor and a resistor. During oscillating, each value of the capacitor and resistor is made to change depending on temperature, thereby realizing a stabilization of the oscillation frequency.
(2) Indirect Analog Compensation System In this system, a crystal oscillator to be temperature-compensated is a voltage-controlled crystal oscillating circuit (VCXO) 3 as shown in FIG. 7. For temperature compensation, a temperature sensor 1 detects an operating temperature of the crystal oscillator, and a temperature compensation voltage generating circuit 2 generates a temperature compensation voltage for compensating the temperature characteristic of a crystal resonator 4 based on the above detected temperature. Then, by applying the temperature compensation voltage to a voltage control terminal of the voltage-controlled crystal oscillating circuit 3, the temperature compensation for it is performed.

When the crystal resonator is made of AT cut crystal, its temperature characteristic can be accurately approximated with a cubic function. Therefore, the temperature compensation circuit is generally composed of a temperature sensor having a temperature characteristic represented by a linear function, and a cubic function generating circuit that generates a cubic function depending on the temperature detected by the temperature sensor.
(3) Indirect Digital Compensation System The basic concept regarding the temperature compensation of this system is similar to that of the indirect analog system described above, except that the temperature detected by the temperature sensor 1 is digitally processed to generate the temperature compensation voltage.

That is, in this system of temperature compensation, as shown in FIG. 8, the temperature detected by the temperature sensor 1 is AD converted into a digital value by an AD converter 5. Then, the temperature compensation data which is used to compensate the temperature characteristic of the crystal resonator 4, and which has been stored in advance at the address of a non-volatile memory 6 corresponding to the converted digital value is read. The temperature compensation data read is DA converted into the temperature compensation voltage in analog form by DA converter 7. By supplying the temperature compensation voltage in analog form to the voltage-controlled crystal oscillating circuit 3, the temperature compensation is performed. Here, an EEPROM or the like may be used as the non-volatile memory 6.
(4) Temperature Compensation by Constant Temperature Oven In this method, a crystal oscillator is placed in a small constant temperature oven and thus kept at constant ambient temperature, thereby eliminating the temperature dependence of the crystal oscillator caused by variations in outside-air temperature. Therefore, the oscillation frequency is kept constant.

However, all of the conventional temperature compensation methods (1)–(4) have a problem that it is difficult to realize high-accuracy temperature compensation at low cost (frequency deviation in the temperature characteristic is less than about 0.01 ppm). The concrete contents of this problem are as follows.

Although the analog system of (1) and (2) can be realized at the lowest cost among the methods described above, it is difficult to realize a mass production level of the crystal oscillators with a medium degree of temperature compensation accuracy (below 1 ppm) due to the following reason. That is, it is difficult to improve the temperature compensation accuracy because, in the method of (1), variations in each of the passive elements associated with the temperature compensation have an effect on the accuracy, and, in the method of (2), the temperature compensating circuits are realized with analog circuits.

On the other hand, the method of (3) in principle has the possibility that it realizes the high-accuracy temperature compensation by increasing the resolution of the AD converters and DA converters and also increasing the storage capacity of the non-volatile memories. However, to this end, it is necessary that the bit count of the AD and DA converters is above 15 bits, and that, if the data is not interpolated, the storage capacity of the non-volatile memories is 15 bits (32768 addresses)×15 bits=about 500 kbits. Therefore, in integrating such circuits into an integrated circuit, it becomes a large-scale integrated circuit.

Furthermore, the method of (4) requires a small constant temperature oven and thus has a problem of considerably high cost.

Considering these problems, the inventor has conducted research with enthusiasm toward a solution to the problems. As a result, the inventor has found following matters; that is, first the temperature compensation of a crystal oscillator is performed by the technique of analog manner based on the temperature detected by a temperature sensor, and on the other hand, with respect to the error portion resulting from the temperature compensation the temperature compensation is performed by the technique of a digital manner based on the temperature detected by the temperature sensor, and consequently it is possible to realize decreased manufacturing cost by the smaller scale of the oscillator circuit and the high-accuracy temperature compensation.

An object of the invention attained by the new findings above described is to provide a temperature-compensated crystal oscillator and a method of temperature compensating a crystal oscillator which allow the realization of decreased manufacturing cost by a smaller scale circuit and the high-accuracy temperature compensation.

DISCLOSURE OF THE INVENTION

The invention provides a temperature-compensated crystal oscillator which includes a voltage-controlled crystal oscillating circuit controlled in oscillation frequency with a temperature compensation signal for performing the temperature compensation of a crystal resonator, and which brings the voltage-controlled crystal oscillating circuit into oscillation by the use of the crystal resonator. Further, the temperature-compensated crystal oscillator includes: a temperature sensor for detecting the operating temperature of the crystal oscillator; analog temperature compensating means for generating a temperature compensation voltage of an approximate quadratic function, an approximate cubic function, or an approximate quartic or more function corresponding to the temperature characteristic of the crystal resonator based on the temperature detected by the temperature sensor, and for supplying the generated voltage to the voltage-controlled crystal oscillating circuit; and digital temperature compensating means for AD converting the temperature detected by the temperature sensor, for outputting temperature compensation data in digital form which have been stored in advance in a memory in association with the AD converted value, for DA converting the temperature compensation data into the temperature compensation voltage in analog form, and for supplying the temperature compensation voltage to the voltage-controlled crystal oscillating circuit, and the temperature-compensated crystal oscillator is characterized in that the oscillation frequency of the voltage-controlled crystal oscillating circuit is controlled based on both of the temperature compensation voltages from both of said temperature compensating means.

Further, an embodiment of the temperature-compensated crystal oscillator of the invention includes a temperature-compensated crystal oscillator, characterized in that the analog temperature compensating means comprises cubic function generating means for generating a temperature compensation voltage of an approximate cubic function corresponding to the temperature characteristic of the crystal resonator based on the temperature detected by the temperature sensor, and a memory storing in advance data for setting a predetermined coefficient of the temperature compensation voltage generated by the cubic function generating means, wherein the coefficient generated by the cubic function generating means is set by the data read from the memory.

Furthermore, an embodiment of the temperature-compensated crystal oscillator of the invention includes a temperature-compensated crystal oscillator, characterized in that the digital temperature compensating means comprises an AD converter for AD converting the temperature detected by the temperature sensor, a non-volatile memory for generating the temperature compensation data in digital form which have been stored in advance in association with the AD converted value by the AD converter, and a DA converter for DA converting the temperature compensation data from the non-volatile memory into the temperature compensation data in analog form.

Still further, an embodiment of the temperature-compensated crystal oscillator of the invention includes a temperature-compensated crystal oscillator, characterized in that the analog temperature compensating means and the digital temperature compensating means are integrated into one chip on a semiconductor substrate.

According to the temperature-compensated crystal oscillator comprising these configuration of the invention, the analog temperature compensating means processes the temperature detected by the temperature sensor by the technique of an analog manner to generate a predetermined temperature compensation voltage corresponding to the detected temperature, and supplies the temperature compensation voltage to the voltage-controlled crystal oscillating circuit. On the other hand, the digital temperature compensating means processes the temperature detected by the temperature sensor by the technique of a digital manner to generate a predetermined temperature compensation voltage corresponding to the detected temperature, and supplies the temperature compensation voltage to the voltage-controlled crystal oscillating circuit.

For these reasons, according to the invention, the analog temperature compensating means can provide temperature compensation of medium or more accuracy, and the digital temperature compensating means can temperature compensate more finely for the error portion resulting from the temperature compensation of medium accuracy. Therefore, high-accuracy temperature compensation can be performed as a whole.

Further, according to the invention, as the analog temperature compensating means generates the temperature compensation voltage by the technique of an analog manner, the scale of the circuit for the analog temperature compensating means can be made relatively small. On the other hand, although the digital temperature compensating means generates the temperature compensation voltage by the technique of a digital manner, the bit count of the digital signals to be treated can be decreased and therefore the scale of the circuit for the digital temperature compensating means can be made relatively small. For these reasons, the scale of the whole circuit can be made smaller, resulting in the realization of decreased manufacturing cost.

Further, according to the temperature-compensated crystal oscillator of the invention, when the analog temperature compensating means and the digital temperature compensating means are integrated into one chip on a semiconductor substrate, the advantages described above can be realized easily and reliably.

The invention also provides a method of performing the temperature compensation of a crystal oscillator, characterized in that a method of performing the temperature compensation of a crystal oscillator by supplying a temperature compensation signal to a voltage-controlled crystal oscillating circuit comprises detecting the operating temperature of the crystal oscillator, generating a predetermined temperature compensation signal corresponding to the detected temperature by the technique of an analog manner, and thereby performing analog temperature compensation of the crystal oscillator based on the temperature compensation signal, and further comprises, on the other hand, for the error portion resulting from the analog temperature compensation, generating a predetermined temperature compensation signal corresponding to the detected temperature by the technique of a digital manner, and performing digital temperature compensation of the crystal oscillator based on the temperature compensation.

Further, an embodiment of the method of performing the temperature compensation of a crystal oscillator of the invention includes the temperature compensation method for a crystal oscillator, characterized in that the analog temperature compensation is based on the detected temperature and comprises a process for generating the temperature compensation voltage of an approximate cubic curve corresponding to the temperature characteristic of the crystal resonator.

Furthermore, an embodiment of the method of performing the temperature compensation of a crystal oscillator of the invention includes the temperature compensation method for a crystal oscillator characterized in that the digital temperature compensation comprises a first process of determining a AD converted value by AD converting the detected temperature, a second process of generating temperature compensation data in digital form which have been stored in advance in a memory in association with the AD converted value determined, a third process of DA converting the temperature compensation data into a temperature compensation voltage in analog form.

Thus, according to the invention, in performing the temperature compensation of crystal oscillator, the analog temperature compensation can perform temperature compensation with medium or more accuracy, and the digital temperature compensation can temperature compensate more finely for the error portion resulting from the analog temperature compensation, allowing the realization of the high-accuracy temperature compensation as a whole.

Further, according to the invention, as the analog temperature compensation generates the temperature compensation voltage by a technique of an analog manner, in realizing a circuit for the analog temperature compensation, the scale of the circuit can be made relatively small. On the other hand, although the digital temperature compensation generates the temperature compensation voltage by the technique of a digital manner, the bit count of digital signals to be treated can be decreased, and therefore, in realizing a circuit for the digital temperature compensation, the scale of the circuit can be made relatively small. For these reasons, in realizing the temperature-compensated crystal oscillator, the scale of the whole circuit can be made small, resulting in the realization of decreased manufacturing cost.

BRIEF DESCRIPTION OF THE DRAWINGS

FIG. 1 is a block diagram for showing an example of a configuration of an embodiment of the invention;

FIG. 5 shows an example of measurements of each temperature and a corresponding frequency deviation, illustrating an example of the temperature compensation by the analog-type temperature compensating section only;

BEST MODE FOR CARRYING OUT THE INVENTION

Figure 2:
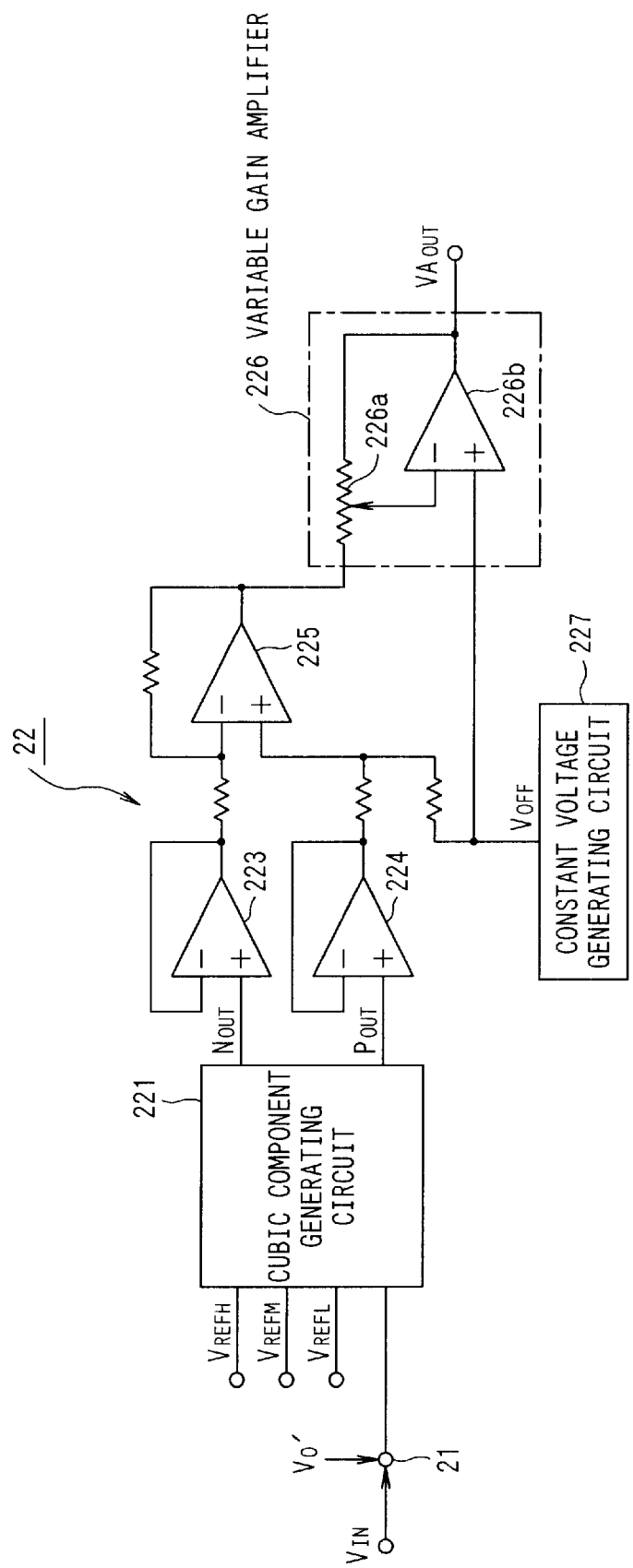
FIG. 2 is a block diagram for showing an example of a configuration of a cubic component and constant component generating section of FIG. 1.

Hereinafter, the embodiments of the invention will be described with reference to the drawings.

FIG. 1 is a block diagram for showing an example of a configuration of an embodiment of the invention.

As shown in FIG. 1, a temperature-compensated crystal oscillator according to this embodiment comprises at least a temperature sensor 11, an analog-type temperature compensating section 12, a digital-type temperature compensating section 13, an adder circuit 14, and a voltage-controlled crystal oscillating circuit 3.

In this temperature-compensated crystal oscillator, based on an input voltage corresponding to the temperature detected by the temperature sensor 11, the analog-type temperature compensating section 12 generates a predetermined temperature compensation voltage $V_1$ corresponding to the detected temperature by the technique of an analog manner, and on the other hand, the digital-type temperature-compensating section 13 generates a predetermined temperature compensation voltage $V_2$ corresponding to the detected temperature by the technique of a digital manner, and further both of these temperature compensation voltages are added by the adder circuit 14, and the resulting added voltage $V_3$ is applied to the voltage control terminal of the voltage-controlled crystal oscillating circuit 3, thereby the temperature compensation of the crystal oscillator being performed.

Further, in the temperature-compensated crystal oscillator, at least the analog type temperature compensating section 12, digital type temperature compensating section 13, and adder circuit 14 are integrated into one chip on a semiconductor substrate, among the temperature sensor 11, analog type temperature compensating section 12, digital type temperature compensating section 13, and adder circuit 14 as shown in FIG. 1. Thereby, a smaller circuit of the temperature-compensated crystal oscillator and lower cost thereof can be realized.

Next, examples of configurations of each portion of the temperature-compensated crystal oscillator according to this embodiment will be described in more detail.

The temperature sensor 11 is provided for detecting the operating temperature (operating atmosphere temperature) of the voltage-controlled crystal oscillating circuit 3. The analog output voltages of the temperature sensor 11 corresponding to the detected temperature change in the manner of a linear function with changes in temperature. The analog output voltage of the temperature sensor 11 is input to the analog type temperature compensating section 12 and the digital-type temperature compensating section 13 as the respective input voltages $V_{IN}$.

The approximate cubic-function generating device disclosed in International Publication specification (International Publication WO 98/56105) previously filed by the present applicant can be used for the analog type temperature compensating section 12. Therefore, the general outlines of the approximate cubic-function generating device will be described with reference to FIG. 1 and FIG. 2.

The analog type temperature compensating section 12 is for generating the temperature compensation voltage $V_1$, which can be expressed by an equation (2) described later. As shown in FIG. 1, the analog type temperature compensating section 12 comprises an adder 21 for adding a variable voltage $V_0'$ to the input voltage $V_{IN}$, a cubic-component and constant component generating portion 22 which the added output $V_s$ from the adder 21 is input into and which generates a cubic component and a constant component of the first term in the equation (2) described later based on the added output $V_s$, a first-degree component generating portion 23 for generating only a component of first degree in the second term of the equation (2) described later, and an adder circuit 24 for adding both output signals of the cubic-component and constant component generating portion 22 and the first-degree-component generating portion 23.

Further, as shown in FIG. 1, the analog type temperature compensating section 12 comprises a non-volatile memory 28, and is adapted to automatically set each of the adjustment values for the variable voltage $V_0'$, offset voltage $V_{OFF}$, variable resistor in the first-degree component generating portion 23, and variable resistor 226a as described above by using each of coefficient setting data which have been stored in advance in the non-volatile memory 28.

As shown in FIG. 2, the cubic-component and constant-component generating portion 22 comprises a cubic component generating circuit 221 for generating only the cubic component based on the added output $V_s$ from the adder 21 and referred constant voltages $V_{REFH}$, $V_{REFM}$, and $V_{REFL}$, buffer circuits 223 and 224 to which the non-inverted output signal $P_{OUT}$ and inverted output signal $N_{OUT}$ from the cubic component generating circuit 221 are respectively input, a differential amplifier circuit 225 which differentially amplifies the respective outputs of the buffer circuits 223 and 224, a variable gain amplifier circuit 226 into which the output of the differential amplifier circuit 225 is input, and a constant-voltage generating circuit 227 for generating any offset voltage $V_{OFF}$.

The variable gain amplifier 226 comprises an operational amplifier 226b, and a variable resistor 226a of an electronic volume connected between the output terminal of the operational amplifier 226b and the—input terminal thereof. Further, the value of the variable resistor 226a is adjusted based on the data from the non-volatile memory 28, thereby the variable gain amplifier 226 being adapted to change its gain.

On the other hand, as shown in FIG. 1, the digital type temperature compensating section 13 comprises an AD converter 25 for AD converting an analog input voltage $V_{IN}$ corresponding to the temperature detected by the temperature sensor 11 into a digital value, a non-volatile memory 26 for storing in advance the temperature compensation data for the crystal resonator 4 corresponding to the digital output values of the AD converter 25, and an DA converter 27 for DA converting the temperature compensation data in digital form from the non-volatile memory 26 into the temperature compensation voltage in analog form.

The non-volatile memory 26 comprises EEP-ROM or the like, and the addresses of the non-volatile memory 26 are correlated with the digital output values of the AD converter 25. For example, if the digital output values of the AD converter 25 are n bits, the addresses of the non-volatile memory 26 are also provided with n bits. Further, predetermined temperature compensation data obtained in the later described manner are stored at the address equal to a digital output value in advance.

The adder circuit 14 is configured to add the temperature compensation voltage output from the adder circuit 24 of the analog type temperature compensating section 12 and the temperature compensation voltage output from the DA converter 27 of the digital type temperature compensating section 13, and to supply the resultant added temperature compensation voltage to the voltage control terminal of the voltage-controlled crystal oscillation circuit 3.

Next, an example of an operation of the temperature-compensated crystal oscillator according to the embodiment having a configuration described above will be described.

Figure 3:
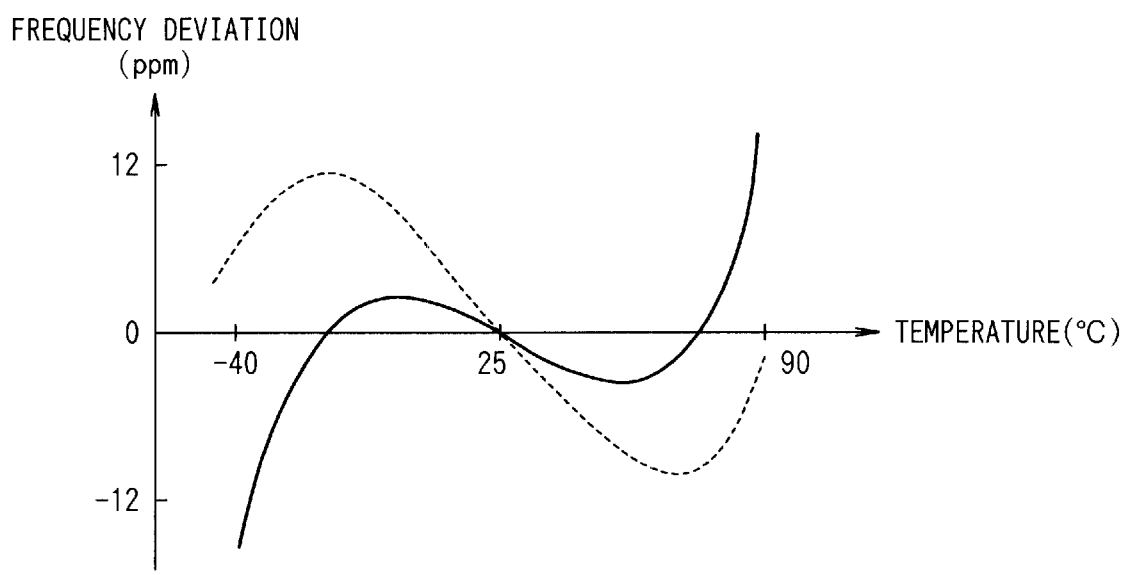
FIG. 3 is a diagram showing an example of a temperature characteristic of a crystal resonator.

First, before describing the operation of this embodiment, the temperature characteristic of the crystal resonator 4 included in the voltage-controlled crystal oscillating circuit 3 will be described. Generally, when the horizontal axis indicates temperatures (° C.) and the vertical axis indicates frequency deviations (ppm), the frequency deviation of the crystal resonator 4 can be for example represented by a curve of FIG. 3. This frequency deviation Y can be approximated with the following equation (1).

$$Y = \alpha \times (t-t_0)^3 + \beta \times (t-t_0) + \gamma \quad (1)$$

Here, in the equation (1), $\alpha$ is a coefficient of the cubic term, $\beta$ is the slope of the temperature characteristic, $\gamma$ is a offset of frequency, t is ambient temperature, and $t_0$ is temperature at the center of the curve (normally, in the range from 25° C. to 30° C.).

$\alpha$, $\beta$, and $\gamma$ in this equation (1) each depend on the characteristics of the crystal resonator 4 and the voltage-controlled crystal oscillating circuit 3, and in particular, largely on the crystal resonator 4. They are influenced by the shape, size and so on of the crystal resonator 4.

The voltage-frequency characteristics of the voltage-controlled crystal oscillating circuits 3 widely used at the present time can be approximated with a linear function, so that the frequency characteristic dependent on temperature of the crystal resonator 4 can be met with its voltage characteristic dependent on temperature.

For this reason, this embodiment performs the temperature compensation of the crystal resonator 4 based on the temperature compensation voltage $V_1$ generated by the analog type temperature compensation section 12 and the temperature compensation voltage $V_2$ generated by the digital type temperature compensation section 13.

Here, the operation of this embodiment will be described. In the analog type temperature compensation section 12, when the input voltage $V_{IN}$ corresponding to the temperature detected by the temperature sensor 11 is input to the adder 21, the adder 21 adds the input voltage $V_{IN}$ and the variable voltage V', and outputs the resultant added voltage $V_s$. The cubic component and constant component generating portion 22 generates an output voltage $V_{AOUT}$ consisting of a cubic component and a constant component, based on the added voltage $V_s$.

Further, the first-degree component generating portion 23 generates an output voltage $V_{BOUT}$ associated with a component of first degree based on that added voltage $V_s$. The adder circuit 24 adds the output voltage $V_{AOUT}$ from the cubic component and constant component generating portion 22 and the output voltage $V_{BOUT}$ from the first-degree component generating portion 23, thereby outputting the temperature compensation voltage $V_1$ expressed by the following equation (2).

$$V_1 = b_3'(V_{IN}-V_0)^3 + b_1'(V_{IN}-V_0) + b_0' \quad (2)$$

Here, in the equation (2), $V_0$ is a difference between the referred reference voltage $V_{REFM}$ and the variable voltage $V_0'$, and therefore $V_0$ can be arbitrarily set by adjusting the variable voltage $V_0'$. Further, the coefficient $b_3'$ of the cubic component can be adjusted by adjusting the gain of the cubic component generating circuit 221 and the gain of the variable gain amplifier 226. Furthermore, the coefficient $b_1'$ of the component of first degree can be adjusted by adjusting the resistance value of a variable resistor (not shown) included in the first-degree component generating portion 23 and the gain of a non-inverting amplifier (not shown). Further, the constant $b_0'$ can be adjusted with the offset voltage $V_{OFF}$ set by the constant voltage generating circuit 227.

Figure 4:
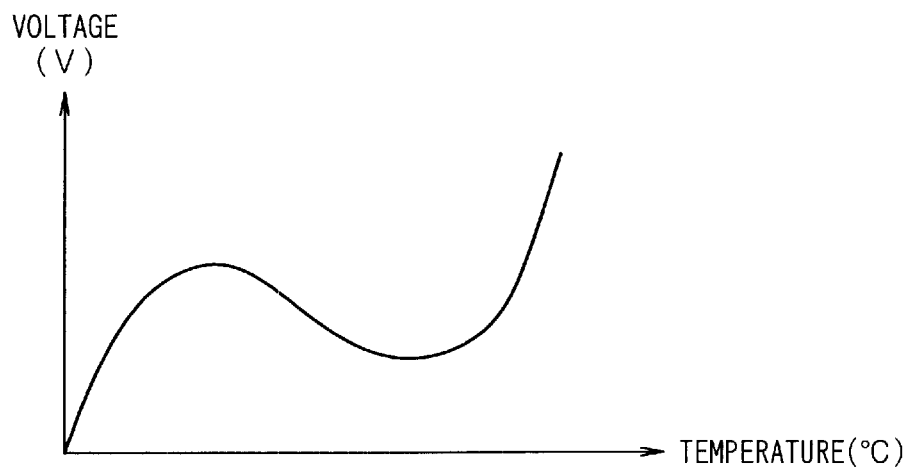
FIG. 4 is a diagram showing an example of an output voltage (temperature compensation voltage) of an analog-type temperature compensating section.

Because the setting of these coefficients and constant can be independently adjusted, the temperature compensation voltage $V_1$ of the analog type temperature compensating section 12 can be any cubic function as shown in FIG. 4.

Then, the setting of these coefficients and constant is carried out by reading each coefficient-setting data which has been in advance determined and stored in the non-volatile memory 28 as descried later during operation, and by adjusting electronically the resistance values of the above variable resistor or the like with use of the data read.

Figure 6:
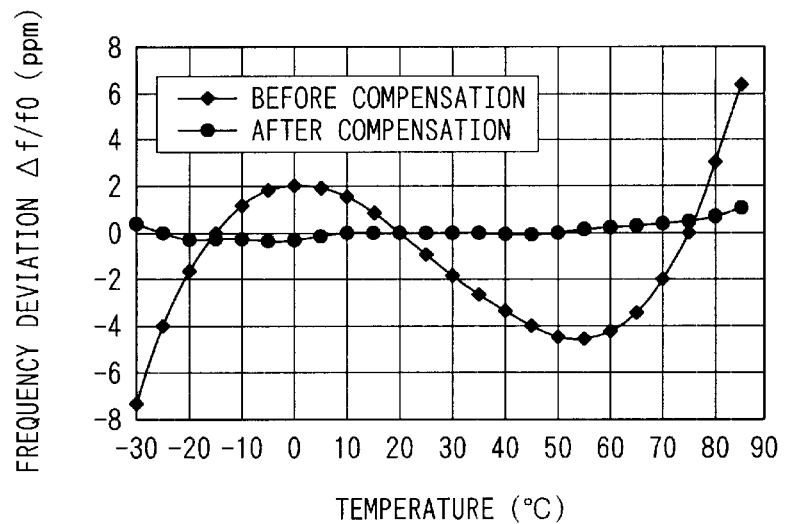
FIG. 6 is a diagram graphically representing those measurement results.
Figure 7:
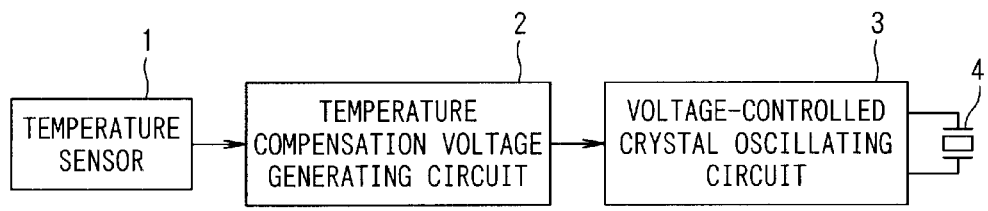
FIG. 7 is a block diagram showing a conventional temperature-compensated crystal oscillator.

Here, FIGS. 5 and 6 show an example of the temperature compensation of the crystal resonator 4 carried out by means of the analog type temperature compensating section 12 only. In this case, the temperature compensation was performed in the range of operating temperature from −30° C.

to 85° C. It can be seen that before temperature compensation by the analog type temperature compensating section 12, the frequency deviation of the crystal resonator 4 is about ±8 ppm, and after the temperature compensation, the frequency deviation is decreased to ±1 ppm and below.

On the other hand, in the digital type temperature compensating section 13, when the input voltage $V_{IN}$ in analog form corresponding to the temperature detected by the temperature sensor 11 is input to the AD converter 25, the AD converter 25 AD converts the input voltage $V_{IN}$ into a digital voltage. This digital voltage corresponds to an address of the non-volatile memory 26, and the compensation data required for temperature compensating of the crystal resonator 4 has been stored at the address. Therefore, the compensation data is read from the non-volatile memory 26. The compensation data in digital form is DA converted into the compensation voltage in analog form by DA converter 27.

When the temperature compensation voltage $V_1$ from the analog type temperature compensating section 12 and the temperature compensation voltage $V_2$ from the digital type temperature compensating section 13 obtained in such manners are input to the adder circuit 14, the adder circuit 14 adds them and applies the resultant added voltage $V_3$ to the voltage control terminal of the voltage-controlled crystal oscillating circuit 3. Thus, the voltage-controlled crystal oscillating circuit 3 can oscillate with stability at a predetermined frequency in the range of the operating temperature.

By the way, this embodiment requires storing each coefficient-setting data described later into the non-volatile memory 28 in order to set the gain of each portion or the like such that the analog type temperature compensating section 12 can carry out a desired operation of temperature compensation during operation. In addition, this embodiment requires storing temperature compensation data into the non-volatile memory 26 such that the digital type temperature compensating section 13 can perform a desired operation during operation. These works are performed with housing the crystal oscillator in a constant temperature oven during manufacturing, which will be described bellow.

First, the adjustment of the analog type temperature compensating section 12 is performed while keeping the digital type temperature compensating section 13 in a quiescent state and the analog type temperature compensating section 12 disconnected from the adder circuit 14. That is, the temperature of the constant temperature oven is set to the temperature at which the temperature compensation is desired, for example the minimum operating temperature. Then, at this minimum temperature, an external input voltage $V_{Cin}$ is input to the adder circuit 14 instead of the output voltage from the digital type temperature compensating section 13. By varying the voltage value of this input voltage $V_{Cin}$, the input voltage $V_{Cin1}$ providing a predetermined oscillation frequency is measured and further the output voltage $V_{Cout1}$ from the analog type temperature compensating section 12 at that time is also measured. During this measurement, a predetermined voltage is input to the adder circuit 14 from the DA converter 27.

The measurement processing described above is repeated with increasing the setting temperature of the constant temperature oven sequentially to different temperatures until the maximum operating temperature is reached. Thus, the input voltages $V_{Cin1}$ to $V_{CinN}$ of the adder circuit 14 at each set temperature and also the output voltages $V_{Cout1}$ to $V_{CoutN}$ from the analog type temperature compensating section 12 are measured at each of the setting temperatures.

Then, each of the input voltages $V_{Cin1}$ to $V_{CinN}$ measured and each of the output voltages $V_{Cout1}$ to $V_{CoutN}$ measured are approximated as a function of temperature with the following equations (3) and (4).

$$V_{Cin}(T)=\alpha_3(T-T_0)^3+\alpha_1(T-T_0)+\alpha_0 \quad (3)$$

$$V_{Cout}(T)=\beta_3(T-T_0')^3+\beta_1(T-T_0')+\beta_0 \quad (4)$$

Here, the coefficients $\alpha_3$, $\alpha_1$, and constant $\alpha_0$ in the equation (3) correspond to $\alpha$, $\beta$, and $\gamma$ in the equation (1) described above, respectively, and thus these values depend on the crystal resonator.

Then, it is necessary to adjust the analog type temperature compensating section 12 so as to satisfy the following conditions; $\beta_3=\alpha_3$, $\beta_1=\alpha_1$, $\beta_0=\alpha_0$ and $T_0'=T_0$. That is, the concrete adjustment of the analog type temperature compensating section 12 is performed as follows; the center temperature $T_0'$ of the cubic function curve of the equation (4) described above is adjusted by the variable voltage $V_0'$ applied to the adder 21 in FIG. 1, the constant coefficient $\beta_0$ is adjusted by the offset voltage $V_{OFF}$ output from the constant voltage generating circuit 227 in FIG. 2, the coefficient of first degree $\beta_1$ is adjusted by a variable resistor (not shown) in the first-degree component generating portion 23, and further the cubic coefficient $\beta_3$ is adjusted by the variable resistor 226a of the variable gain amplifier 226 shown in FIG. 2 in the cubic component and constant component generating portion 22.

Here, the analog type temperature compensating section 12 is designed such that each of the adjustment values of the variable voltage $V_0'$, offset voltage $V_{OFF}$, variable resistor in the first-degree component generating portion 23, and variable resistor 226a as described above may be set electronically with use of each coefficient setting data which has been stored in advance in the non-volatile memory 28.

Then, data corresponding to each of the coefficient setting data is input into the analog type temperature compensating section 12 and, at the same time, the value of the data input is changed so as to determine each of the adjustment values satisfying the above conditions $\beta_3=\alpha_3$, $\beta_1=\alpha_1$, $\beta_0=\alpha_0$ and $T_0'=T_0$. Then, each coefficient setting data corresponding to each of the determined adjustment values is determined. Thus, each coefficient setting data determined above is in advance stored in the non-volatile memory 28 of the analog type temperature compensating section 12.

Next, the works will be described for storing the temperature compensation data corresponding to the temperature detected by the temperature sensor 11 into the non-volatile memory 26 of the digital type temperature compensating section 13.

In this case, the temperature of the constant temperature oven is set to the minimum operating temperature, for example. Then, the output cord (output data) of the AD converter 25 corresponding to the temperature detected by the temperature sensor 11 is measured. At the same time, by externally changing the input cords (input data) to the DA converter 27, the input code providing the minimum frequency deviation of the crystal resonator 4, i.e. the minimum error of the oscillation frequency of the voltage-controlled crystal oscillating circuit 3 is measured.

The hereinbefore measurement processing is repeated with increasing sequentially the setting temperature of the constant temperature oven to different temperatures until the maximum operating temperature is reached, thus an output code of the AD converter 25 and an input code of the DA converter 27 at each setting temperature being measured, respectively.

Then, each of the measured output codes from the AD converter 25 is taken as an address of the non-volatile memory 26 and then the input code (temperature compensation data) corresponding to the output code (detected temperature) is written into the non-volatile memory 26 as the content of this address.

As described above, according to the temperature-compensated crystal oscillator of this embodiment, the analog type temperature compensating section 12 processes the temperature detected by the temperature sensor 11 by the technique of an analog manner to generate a predetermined temperature compensation voltage corresponding to the detected temperature. On the other hand, the digital type temperature compensating section 13 processes the temperature detected by the temperature sensor 11 by the technique of a digital manner to generate a predetermined temperature compensation voltage corresponding to the detected temperature. Then, both of these temperature compensation voltages are applied to the voltage control terminal of the voltage-controlled crystal oscillating circuit 3.

For this reason, relatively rough temperature compensation is achieved using the temperature compensation voltage $V_1$ generated by the analog type temperature compensating section 12. In addition, the error portion resulting from the analog type temperature compensation can be more finely temperature-compensated with use of the temperature compensation voltage $V_2$ generated by the digital type temperature compensating section 13. As a result, the high-accuracy temperature compensation can be achieved as a whole.

Further, because the analog type temperature compensating section 12 processes the temperature detected by the temperature sensor 11 by the technique of an analog manner, the scale of the circuit for the analog type temperature compensating section 12 can be made relatively small. Although the digital type temperature compensating section 13 processes the temperature detected by the temperature sensor 11 by the technique of a digital manner, the bit count of the digital signals to be treated can be decreased, and thus the scale of the circuit for the digital type temperature compensating section 13 can be made relatively small. Therefore, the scale of the whole circuit can be made small as a whole, resulting in the realization of decreased manufacturing cost.

By the way, the bit count of the AD converter 25 in FIG. 1 is determined by the maximum value of a differential coefficient ($\Delta f/\Delta°$ C.) of the temperature characteristic of the frequency to be compensated. Although the frequency deviation (temperature characteristic) of crystal resonators is in the order of about 1 ppm/° C., the frequency deviation of error portions resulting from the temperature compensation performed by the analog type temperature compensating section 12 can be decreased to the order of about 0.1 ppm.

Further, the frequency deviation to be temperature-compensated by the output of the DA converter 27 of the digital type temperature compensating section 13 is about ±15 ppm when the analog type temperature compensating section 12 is not used, but about ±2 ppm when it is used as in this embodiment.

Figure 8:
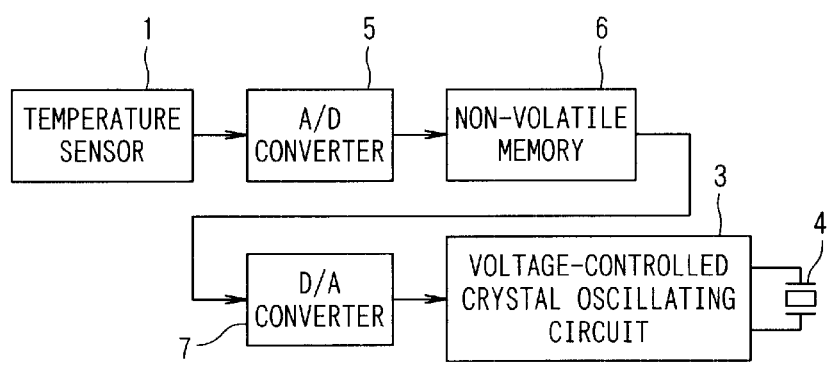
FIG. 8 is a block diagram showing another conventional temperature-compensated crystal oscillator.

Therefore, when compared to the temperature compensation of crystal resonators performed by the conventional digital method only as shown in FIG. 8, it is possible to decrease the respective bit counts of the AD converter 25 and DA converter 27 required for realizing the same accuracy as by the conventional method. That is, the bit count of the AD converter 25 can be about 3 bits less than in, or 1/10 of, the conventional digital method, and that of the DA converter 27 can be about 3 bits less than in, or 2/15 of, the conventional digital method. Thus, the possibility of the 3 bits decrease in the bit count of the AD converter results in the reduction of the capacity of non-volatile memory 26 to 1/8 of the conventional capacity.

In this embodiment, the case where the temperature characteristic of crystal resonators is represented by a cubic curve has been described, but the invention can be applied to the cases where the temperature characteristic have a quadratic curve or a quartic or more curve. In these cases, the analog type temperature compensating section 12 should generate a temperature compensation voltage of an approximate quadratic function or an approximate quartic or more function corresponding to each curve of the quadratic curve or the quartic or more curve.

Industrial Applicability

As described above, according to the temperature-compensated crystal oscillator of the invention, the analog type temperature compensating means can perform temperature compensation with medium or more accuracy, and the digital temperature compensating means can more finely temperature compensate the error portion resulting from the temperature compensation of medium accuracy, thereby allowing the realization of the high-accuracy temperature compensation as a whole.

Further, according to the temperature-compensated crystal oscillator of the invention, because the analog type temperature compensating means generates temperature compensation signals by the technique of an analog manner, the scale of the circuit for the analog type temperature compensating means can be made relatively small. On the other hand, although the digital type temperature compensating means generates temperature compensation signals by the technique of a digital manner, the bit count of the digital signals to be treated can be decreased, and therefore the scale of the circuit for the digital type temperature compensating means can be made relatively small. For these reasons, the scale of the whole circuit for the temperature-compensated crystal oscillator of the invention can be made small, thereby allowing the realization of decreased manufacturing cost.

Furthermore, according to the temperature-compensated crystal oscillator of the invention, when the analog type temperature compensating means and the digital type temperature compensating means are integrated into one chip on a semiconductor substrate, the advantages described above can be realized easily and reliably.

On the other hand, according to the method of temperature compensating of crystal oscillators of the invention, when performing the temperature compensation of crystal oscillators, the analog temperature compensation can perform temperature compensation with medium or more accuracy and the digital temperature compensation can more finely temperature compensate for the error portions resulting from the temperature compensation of medium accuracy, thereby allowing the realization of the high-accuracy temperature compensation as a whole.

Further, according to the method of temperature compensating of crystal oscillators of the invention, because the analog temperature compensation generates temperature compensation voltages by the technique of an analog manner, in realizing a circuit for the analog temperature compensation, the scale of the circuit can be made relatively small. On the other hand, although the digital temperature compensation generates temperature compensation voltages by the technique of a digital manner, the bit count of digital signals to be treated can be decreased and therefore in realizing a circuit for the digital temperature compensation, the scale of the circuit can be made relatively small. For these reasons, in realizing the temperature-compensated crystal oscillator, the scale of the whole circuit thereof can be made small, thereby allowing the realization of decreased manufacturing cost.

What is claimed is:

1. A temperature-compensated crystal oscillator including a voltage-controlled crystal oscillating circuit for setting said voltage-controlled crystal oscillating circuit into oscillation by the use of a crystal resonator, the oscillation frequency of said voltage-controlled crystal oscillating circuit being controlled with a temperature compensation signal for performing the temperature compensation of said crystal resonator, comprising:

a temperature sensor for detecting an operating temperature of said crystal oscillator;

analog temperature compensating means for generating a temperature compensation voltage of an approximate quadratic function or an approximate cubic function corresponding to the temperature characteristic of said crystal resonator based on the temperature detected by said temperature sensor, and for supplying said generated voltage to said voltage-controlled crystal oscillating circuit; and digital temperature compensating means for AD converting the temperature detected by said temperature sensor, for outputting temperature compensation data in digital form which has been stored in advance in a memory in association with said AD converted value, for DA converting said temperature compensation data into a temperature compensation voltage in analog form, and for supplying said temperature compensation voltage to said voltage-controlled crystal oscillating circuit, characterized in that the oscillation frequency of said voltage-controlled crystal oscillating circuit is controlled based on both of temperature compensation voltages from both of said temperature compensating means.

2. The temperature-compensated crystal oscillator according to claim 1, characterized in that said analog temperature compensating means comprises:

cubic function generating means for generating a temperature compensation voltage of an approximate cubic function corresponding to the temperature characteristic of said crystal resonator based on the temperature detected by said temperature sensor; and a memory storing in advance data for setting a predetermined coefficient of the temperature compensation voltage generated by said cubic function generating means, and said coefficient generated by said cubic function generating means is set by said data read from said memory.

3. The temperature-compensated crystal oscillator according to claim 1, characterized in that said digital temperature compensating means comprises:

an AD converter for AD converting the temperature detected by said temperature sensor;

a non-volatile memory for generating the temperature compensation data in digital form which has been stored in advance in association with the AD converted value by said AD converter; and a DA converter for DA converting the temperature compensation data from said non-volatile memory into the temperature compensation data in analog form.

4. The temperature-compensated crystal oscillator according to claim 1, 2 or 3, characterized in that said analog temperature compensating means and said digital temperature compensating means are integrated into one chip on a semiconductor substrate.

5. A method of performing the temperature compensation of a crystal oscillator by supplying a temperature compensation signal to a voltage-controlled crystal oscillating circuit, characterized by comprising the steps of:

detecting the operating temperature of said crystal oscillator, generating a predetermined temperature compensation signal corresponding to said detected temperature by the technique of an analog manner, and thereby performing analog temperature compensation of said crystal oscillator based on said temperature compensation signal, and on the other hand; and generating a predetermined temperature compensation signal corresponding to said detected temperature by the technique of a digital manner for the error portion resulting from said analog temperature compensation, and performing digital temperature compensation of said crystal oscillator based on the temperature compensation signal.

6. The method of performing the temperature compensation of a crystal oscillator according to claim 5, characterized in that said analog temperature compensation is based on said detected temperature and comprises a process for generating the temperature compensation voltage of an approximate cubic curve corresponding to the temperature characteristic of crystal resonator.

7. The method of performing the temperature compensation of a crystal oscillator according to claim 5 or 6, characterized in that said digital temperature compensation comprises:

a first step of determining an AD converted value by AD converting said detected temperature;

a second step of generating a temperature compensation data in digital form which have been stored in advance in a memory in association with said AD converted value determined; and a third step of DA converting said temperature compensation data into a temperature compensation voltage in analog form.

* * * * *